United States Patent [19]

Höllmüller

[11] Patent Number: 4,662,976

[45] Date of Patent: May 5, 1987

[54] APPARATUS FOR TREATING OBJECTS WITH A TREATMENT FLUID

[76] Inventor: Hans Höllmüller, Kappstr. 69, 7033 Herrenberg, Fed. Rep. of Germany

[21] Appl. No.: 767,288

[22] PCT Filed: Nov. 24, 1984

[86] PCT No.: PCT/EP84/00370

§ 371 Date: Oct. 1, 1985

§ 102(e) Date: Oct. 1, 1985

[87] PCT Pub. No.: WO85/02631

PCT Pub. Date: Jun. 20, 1985

[30] Foreign Application Priority Data

Dec. 14, 1983 [DE] Fed. Rep. of Germany ....... 3345124

[51] Int. Cl.$^4$ .......................... C23F 1/02; B44C 1/22; C03C 15/00; C03C 25/06

[52] U.S. Cl. ................................... 156/345; 156/640; 156/901

[58] Field of Search ............... 156/345, 640, 641, 901; 134/'144, 148, 151, 167 R, 172, 198, 200

[56] References Cited

U.S. PATENT DOCUMENTS 2,895,814  7/1959  Clark .................................. 156/640
3,082,774  3/1963  Benton et al. ......................... 134/63
3,616,049  10/1971  Moore et al. ........................ 156/345
3,630,804  12/1971  Coffman et al. .................... 156/345

FOREIGN PATENT DOCUMENTS 1198170  8/1965  Fed. Rep. of Germany .
2237733  6/1974  Fed. Rep. of Germany ...... 156/345
2340724  3/1975  Fed. Rep. of Germany .

Primary Examiner—William A. Powell
Attorney, Agent, or Firm—Fred Philpitt

[57] ABSTRACT

There is described an apparatus for treating objects with a treatment fluid, more especially an etching or developing machine for the production of printed-circuit boards, wherein the nozzle stock comprising a plurality of nozzles is designed so as to be plate-like. The edges of the plate-like nozzle stock are tightly connected to the housing walls so that the treatment chamber, to which the treatment fluid is applied, is bounded by the nozzle stock in one direction. The nozzles can be fitted and possibly also rotated through the nozzle stock from the side that is directed away from the treatment chamber, so that an effortless exchanging or aligning of the nozzles is possible from outside the treatment chamber (FIG. 1).

14 Claims, 3 Drawing Figures

APPARATUS FOR TREATING OBJECTS WITH A TREATMENT FLUID

The invention relates to an apparatus for treating objects with a treatment fluid, more especially an etching or developing machine for the production of printed-circuit boards, comprising a nozzle stock which is provided inside a housing and which comprises a plurality of nozzles, which are directed towards a treatment chamber, and a channel system for feeding the treatment fluid to the nozzles.

On known etching and developing machines for the production of printed-circuit boards, the nozzle stock is formed by the feeding channels themselves, which constitute an open supporting frame for the nozzles and are situated entirely inside the treatment chamber. The exchanging and setting of the nozzles is extremely troublesome in this construction since the treatment chamber is filled with etching-medium residues and etching-medium vapours, which are corrosive and evil-smelling.

It is the object of the present invention to design an apparatus of the kind mentioned at the beginning in such a way that the fitting, exchanging and possibly the angular setting of the nozzles is possible easily and without any impairment due to residues and vapours of the treatment fluid.

According to the invention, this problem is solved in that
(a) the nozzle stock is designed so as to be plate-like;
(b) the edges of the nozzle stock are tightly connected to the walls of the housing of the apparatus;
(c) the nozzles are insertable from the side of the nozzle stock that is directed away from the treatment chamber and can be passed through a channel in the nozzle stock and project with a neck from the side of the nozzle stock that is directed towards the treatment chamber.

In the plate-like design of the nozzle stock according to the invention, the stock tightly bounds the treatment chamber towards one side. The nozzles can be fitted or exchanged from the "rear", namely the side that is directed away from the treatment chamber, of the nozzle stock. A dismantling of the nozzles is frequently necessary, particularly if it turns out that one of the nozzles is clogged and a search for the respective unsatisfactorily working nozzle has to be carried out.

Expediently, the nozzle is also rotatable inside the nozzle stock from the side that is directed away from the treatment chamber. The rotation of the nozzles, which is particularly important for the setting of fan-shaped or flat spray nozzles, may be effected during the operation of the apparatus.

A particularly appropriate construction of the apparatus is to the effect that the nozzle stock comprises for each nozzle:
(d) a first through bore which connects the side that is directed away from the treatment chamber to a channel and which has a first diameter;
(e) a second through bore which connects the channel to the side that is directed towards the treatment chamber and which has a second diameter that is smaller than the first diameter;
and that each nozzle is designed as a substantially cylindrical insert and comprises:
(f) a first zone having a diameter that is larger than the diameter of the first through bore;
(g) a second zone having a diameter that is somewhat smaller than the diameter of the first through bore but is larger than the diameter of the second through bore;
(h) a nozzle neck whose diameter is smaller than the diameter of the second through bore;
(i) an internal cavity;
(k) at least one channel extending radially from the cavity;
(l) an axial channel connecting the cavity to the face of the nozzle neck;
the ring shoulder connecting the first zone to the second zone tightly abutting a surface which is located on the side of the channel that is directed away from the treatment chamber and the ring shoulder connecting the second zone to the nozzle neck tightly abutting a surface which is located on the side of the channel that is directed towards the treatment chamber.

It is of advantage if the face of the nozzle that is directed away from the treatment chamber is provided with a mark indicating the rotational position of the nozzle within the nozzle stock. In this way, it is possible at any time to find out at a glance what angular positions the various installed nozzles have. With each mark there may be associated on the nozzle stock a scale so that once an optimum setting of the nozzles has been found it can be recorded in writing and can be reproducibly re-established according thereto.

The mark may simultaneously constitute the means to which the force for rotating the nozzle is applied. This means may be formed, for example, by a screw driver slot.

Expediently, the nozzle is fastened to the nozzle stock by means of a cap nut which is screwed on a collar provided with an external thread and located at the side of the nozzle stock that is directed away from the treatment chamber.

The nozzle stock may be reduced in thickness in the zones outside the channels so that the channel system is embossed on one side and/or the other side of the nozzle stock. In this way, material is saved; the nozzle stock as a whole becomes lighter.

Hereinafter, an exemplified embodiment of the invention will be explained in more detail with reference to the drawings, in which FIG. 1 diagrammatically shows a section through an etching machine (nozzle stock not sectioned);

Figure 1:
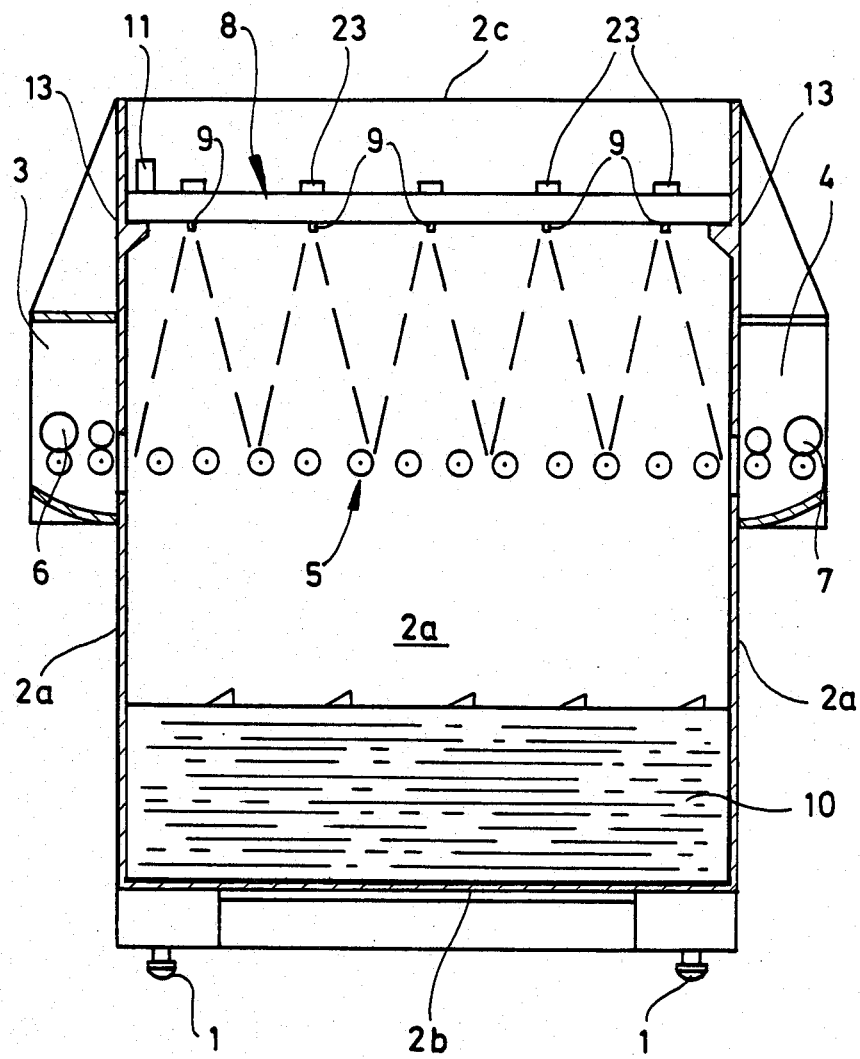

In FIG. 1, there is diagrammatically shown a section through an etching machine for the production of printed-circuit boards. The components which are not necessary to understand the invention have not been shown for the sake of clarity.

The etching machine comprises a housing which stands on feet 1 and is provided with side walls 2a, a bottom wall 2b and possibly a top wall 2c. The latter may be dispensed with, but in any event it should be easily removable (e.g. swingable or slidable).

The material to be etched is transported from a material inlet 3 to a material outlet 4 by a roller conveyor system 5 and is sprayed with an etching medium during this process. In order to prevent any treatment fluid from being transmitted from the machine arranged upstream of the etching machine into the etching machine and from the etching machine into the machine arranged downstream thereof, there are provided at the material inlet 3 and the material outlet 4 squeeze rolls 6 and 7 respectively.

Figure 2:
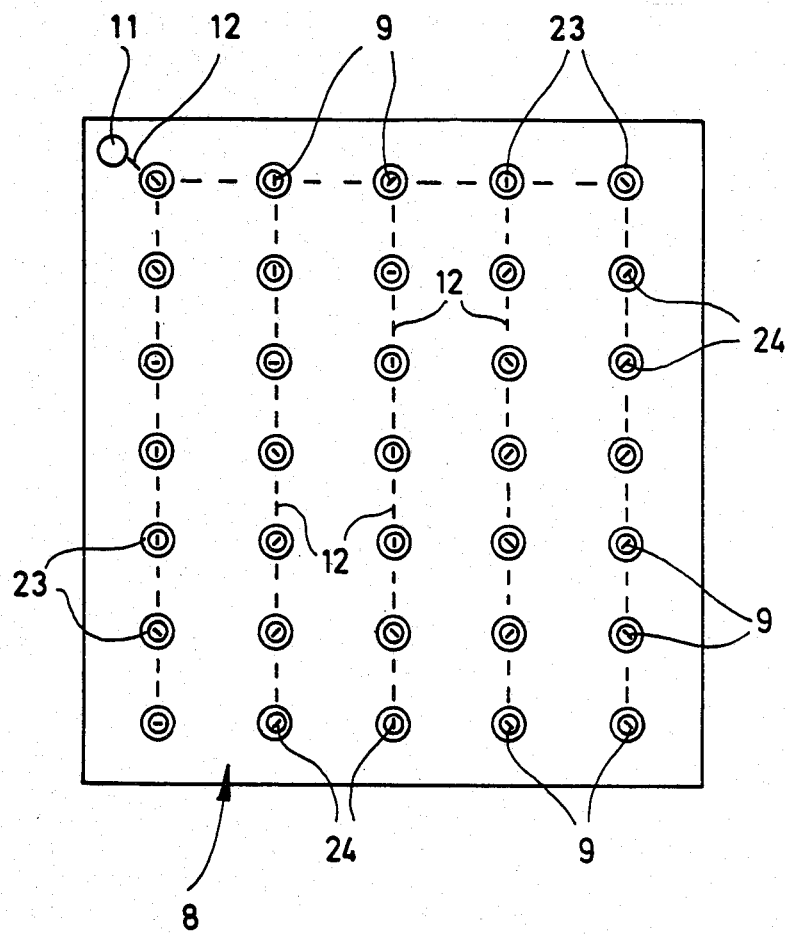
FIG. 2 shows a top view of the nozzle stock shown in FIG. 1.

The spraying of the material to be etched is effected by means of a nozzle stock 8 which is designed in a plate-like manner and in which there are provided a plurality of individual nozzles 9 in a specific pattern (see also FIG. 2). The etching medium sprayed from the nozzles 9 is collected in a sump 10, from which it is conveyed by a pump not shown via a line also not shown to a connection 11 on the nozzle stock 8. From there, the etching medium flows via a channel system 12 formed within the nozzle stock 1 to the individual nozzles 9 (see FIGS. 2 and 5).

The plate-like nozzle stock 8 has been tightly placed on brackets 13 (FIG. 1) fastened to the side walls 2a, for which purpose seals may be interposed. In this way, the etching chamber is bounded towards the top within the etching machine; the space above the nozzle stock 8 stays free from etching medium and etching-medium vapour.

Figure 3:
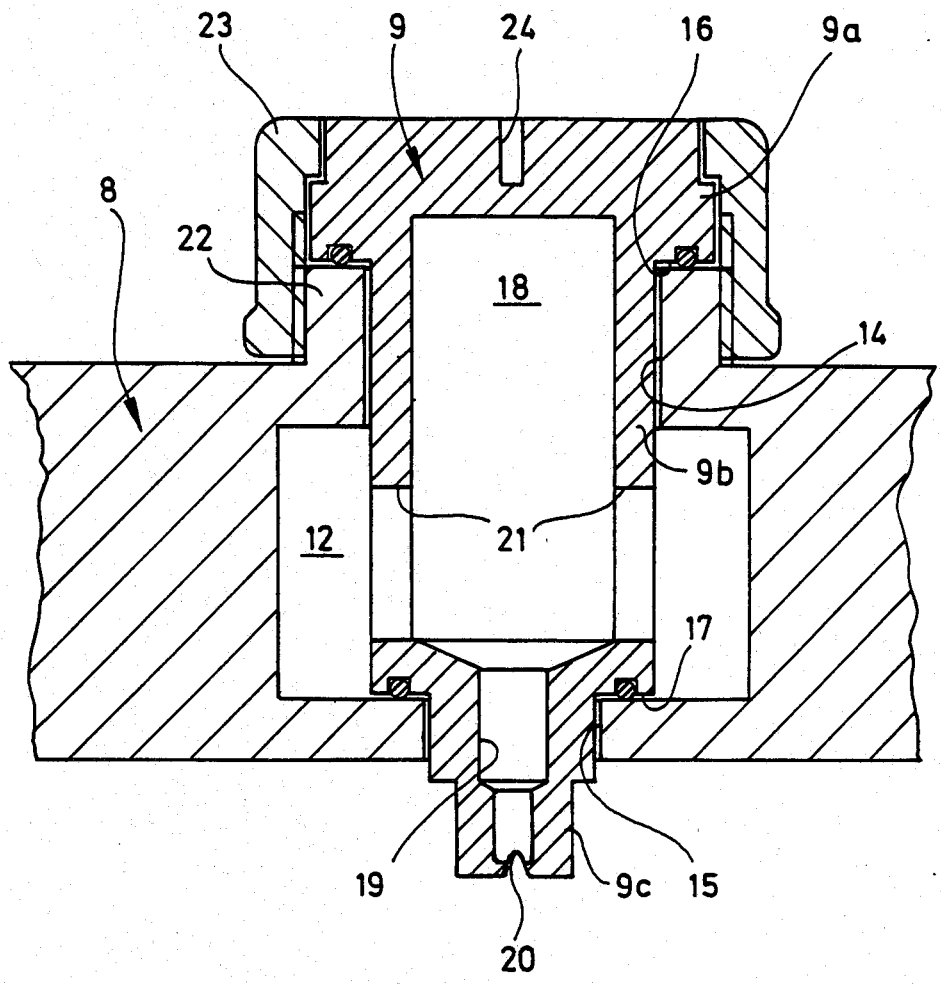
FIG. 3 shows a partial section through the nozzle stock of FIGS. 1 and 2 on an enlarged scale.

The nozzles 9 are fitted from the side of the nozzle stock 8 that is directed away from the etching chamber, as is apparent from FIG. 3 in particular. To this end, the nozzle stock 8 has at the points where a nozzle 9 is to be provided an upper through bore 14, which connects the upper nozzle stock side to the respective channel 12, as well as a lower through bore 15, which connects the channel 12 to the underside of the nozzle stock 8. The diameter of the upper through bore 14 is larger than that of the lower through bore 15.

The nozzle 9 is shaped as a substantially cylindrical insert with (at least) two steps. Its uppermost zone 9a, which is largest in diameter, is connected via a first downwardly pointing ring shoulder 16 to a central zone 9b, whose diameter is somewhat smaller than the diameter of the upper through bore 14 of the nozzle stock 8. The central nozzle zone 9b is connected via a second downwardly pointing ring shoulder 17 to a nozzle neck 9c, whose diameter is smaller than the diameter of the second through bore 15.

The nozzle 9 has an internal cavity 18 which is in communication with the nozzle opening 20 at the lower front end of the nozzle neck 9c via an axially extending channel 19 and with the channel 12 via several radial channels 21.

The nozzle 9 is introduced from the top through the through bores 14, 15, and consequently also through the channel 12, so that its lower ring shoulder 17 rests on the lower internal wall of the channel 12 and its upper ring shoulder 16 rests on the upper face of a fastening collar 22 provided with an external thread and integrally formed with the nozzle stock 1. The entire nozzle is fixed in this position by a cap nut 23 which has been screwed on the fastening collar 22.

O-rings have been inserted into grooves in the ring shoulders 16 and 17 respectively and ensure sealing of the respective counter-surfaces. At least the lower O-ring may be dispensed with since the leaking of etching medium from the channel 12 can be tolerated here to a slight extent and sealing that is adequate in this respect is attainable by suitable machining of the juxtaposed plastics material surfaces.

As can be seen, the nozzle 9 is rotatable in its fitted position, for which purpose a screw-driver slot 24 has been recessed into its upper face. The screw-driver slot 24 simultaneously serves as a mark which reveals the relative rotational position of the nozzle within the nozzle stock 8 from the top (see also FIG. 2).

The above-described exemplified embodiment relates to a continuously operating etching machine with a horizontal stationary nozzle stock 8. Of course, the described design of the nozzle stock as a plate can also be used for other etching machines. In particular, the installed position of the nozzle stock 8 (horizontal, vertical) and the number of nozzle stocks are of no importance. If the nozzle stock 8 as a whole is to carry out a reversing and/or oscillating movement, the tight connection of the nozzle stock 8 to the side walls 2a has to be effected via a flexible bellows, a flexible/elastic cloth or the like.

Of course, the thickness of the plate-like nozzle stock 8 may be reduced in the zone outside the channels 12 so that the channel system will stand out in an embossed manner towards the top and/or the bottom in FIG. 1.

I claim:

1. An apparatus for treating objects introduced into a treating chamber with a treatment fluid, more especially an etching or developing machine for the production of printed-circuit boards, comprising a nozzle stock which is provided inside a housing and which includes a plurality of nozzles that are directed towards the treatment chamber, and a channel system for feeding the treatment fluid to said nozzles, characterized in that
    (a) the nozzle stock (8) is in the form of a plate-like member,
    (b) the edges of the plate-like member of the nozzle stock (8) are tightly connected to the walls (2a) of the housing of the apparatus so as to define one wall of the treatment chamber.
    (c) the nozzles (9) are insertable from the side of the nozzle stock (8) that is directed away from the treatment chamber and can be passed through a channel (12) in the nozzle stock (8) and project with a neck (9c) from the side of the nozzle stock (8) that is directed towards the treatment chamber.

2. An apparatus as claimed in claim 1, characterised in that the nozzles (9) are rotatable inside the nozzle stock (8) from the side that is directed away from the treatment chamber.

3. An apparatus as claimed in claim 1, characterized in that the nozzle stock (8) comprises for each nozzle (9):
    (d) a first through bore (14) connecting the side that is directed away from the treatment chamber to a channel (12) and having a first diameter;
    (e) a second through bore (15) connecting the channel (12) to the side that is directed towards the treatment chamber and having a second diameter, which is smaller than the first diameter;
and in that each nozzle (9) is designed as a substantially cylindrical insert and comprises:
    (f) a first zone (9a) having a diameter that is larger than the diameter of the first through bore (14);
    (g) a second zone (9b) having a diameter that is somewhat smaller than the diameter of the first through bore (14) but is larger than the diameter of the second through bore (15);
    (h) a nozzle neck (9c), whose diameter is smaller than the diameter of the second through bore (15);
    (i) an internal cavity (18);
    (k) at least one channel (21) extending radially from the cavity (18);
    (l) an axial channel (19) connecting the cavity (18) to the face of the nozzle neck (9c);

the ring shoulder (16) connecting the first zone (9a) to the second zone (9b) tightly abutting a surface which is located on the side of the channel (12) that is directed away from the treatment chamber and the ring shoulder (17) connecting the second zone (9b) to the nozzle neck (9c) tightly abutting a surface which is located on the side of the channel that is directed towards the treatment chamber.

4. An apparatus as claimed in claim 2, characterised in that the front of the nozzle (9) that is directed away from the treatment chamber is provided with a mark (24) which indicates the rotational position of the nozzle (9) within the nozzle stock (8).

5. An apparatus as claimed in claim 4, characterised in that the mark (24) simultaneously constitutes the means to which the force for rotating the nozzle (9) is applied.

6. An apparatus as claimed in claim 1, characterised in that the nozzles (9) are each fastened to the nozzle stock (8) by means of a cap nut (23) which has been screwed on a collar (22), which is provided with an external thread and is located at the side of the nozzle stock (8) that is directed away from the treatment chamber.

7. An apparatus as claimed in claim 1, characterised in that the nozzle stock (8) is reduced in thickness in the zone outside the channels (12) so that the channel system (12) is embossed on one side and/or the other side of the nozzle stock (8).

8. An apparatus for treating objects introduced into a treating chamber with a treatment fluid, more especially an etching or developing apparatus for the production of printed circuit boards, comprising in combination
 (a) a housing,
 (b) a planar member extending across the upper portion of said housing so as to define therebelow a treating chamber,
 (c) a network of fluid passageways extending horizontally across said planar member,
 (d) a fluid inlet in said housing for introducing fluid into said network of fluid passageways, and an outlet for fluid from said treating chamber, and
 (e) a plurality of nozzles positioned in a pattern in said planar member, said nozzles
  (1) being located at spaced apart points that intersect said network of fluid passageways,
  (2) being directed downwardly below said planar member and toward said treating chamber, and
  (3) being insertable into said planar member from above and having a neck portion that is adapted to discharge fluid received from said fluid passageways into said treating chamber.

9. An apparatus as claimed in claim 8 wherein said nozzles (9) are rotatable inside the planar member (8) from the side that is directed away from the treatment chamber.

10. An apparatus as claimed in claim 8 wherein the planar member (8) comprises for each nozzle (9):
 (a) a first through bore (14) connecting the side that is directed away from the treatment chamber to a channel (12) and having a first diameter,
 (b) a second through bore (15) connecting the channel (12) to the side that is directed towards the treating chamber and having a second diameter, which is smaller than the first diameter,
and in that each nozzle (9) is designed as a substantially cylindrical insert and comprises:
 (c) a first zone (9a) having a diameter that is larger than the diameter of the first through bore (14);
 (d) a second zone (9b) having a diameter that is somewhat smaller than the diameter of the first through bore (14) but is larger than the diameter of the second through bore (15);
 (e) a nozzle neck (9c) whose diameter is smaller than the diameter of the second through bore (15);
 (f) an internal cavity (18),
 (g) at least one channel (21) extending radially from the cavity (18),
 (h) an axial channel (19) connecting the cavity (18) to the face of the nozzle neck (9c),
the ring shoulder (16) connecting the first zone (9a) to the second zone (9b) tightly abutting a surface which is located on the side of the channel (12) that is directed away from the treatment chamber and the ring shoulder (17) connecting the second zone (9b) to the nozzle neck (9c) tightly abutting a surface which is located on the side of the channel that is directed towards the treatment chamber.

11. An apparatus as claimed in claim 8 wherein the front of the nozzle (9) that is directed away from the treatment chamber is provided with a mark (24) which indicates the rotational position of the nozzle (9) within the planar member (8).

12. An apparatus as claimed in claim 11 wherein the mark (24) simultaneously constitutes the means to which the force for rotating the nozzle (9) is applied.

13. An apparatus as set forth in claim 8 wherein the nozzles (9) are each fastened to the planar member (8) by means of a cap nut (23) which has been screwed on a collar (22), which is provided with an external thread and is located at the side of the planar member (8) that is directed away from the treatment chamber.

14. An apparatus as set forth in claim 8 wherein the planar member (8) is reduced in thickness in the zone outside the channels (12) so that the channel system (12) is embossed on one side and/or the other side of the planar member (8).

\* \* \* \* \*